United States Patent [19]
Wills et al.

[11] Patent Number: 4,623,403
[45] Date of Patent: Nov. 18, 1986

[54] INDEXING OF LASER BEAM FOR PROGRAMMING VLSI DEVICES

[75] Inventors: Kendall S. Wills; Paul A. Rodriguez, both of Houston, Tex.

[73] Assignee: Texas Instruments Incorporated, Dallas, Tex.

[21] Appl. No.: 621,280

[22] Filed: Jun. 15, 1984

[51] Int. Cl.$^4$ .................. G01B 9/02; G01B 11/02
[52] U.S. Cl. .................................. 148/33.3; 29/574; 148/1.5; 148/DIG. 93; 156/644; 156/657; 356/356
[58] Field of Search ............... 29/574; 148/33.3, 1.5; 156/644, 657; 356/356

[56] References Cited

U.S. PATENT DOCUMENTS

| | | | |
|---|---|---|---|
| 4,200,395 | 4/1980 | Smith et al. | 356/356 |
| 4,211,489 | 7/1980 | Klenknecht et al. | 29/574 |
| 4,265,542 | 5/1981 | Snow | 356/356 |
| 4,332,473 | 6/1982 | Ono | 356/356 |
| 4,377,028 | 3/1983 | Imahashi | 29/574 |
| 4,408,884 | 10/1983 | Kleinknecht et al. | 29/574 |
| 4,459,026 | 7/1984 | Pekelsky | 356/356 |
| 4,928,094 | 12/1975 | Angell | 29/578 |

*Primary Examiner*—Upendra Roy
*Attorney, Agent, or Firm*—John G. Graham

[57] ABSTRACT

A target for a laser beam consists of a plurality of closely spaced lines that causes the generation of an readily-identifiable read-out so that the laser beam can be indexed when performing laser scribing for redundant memory devices or the like.

7 Claims, 2 Drawing Figures

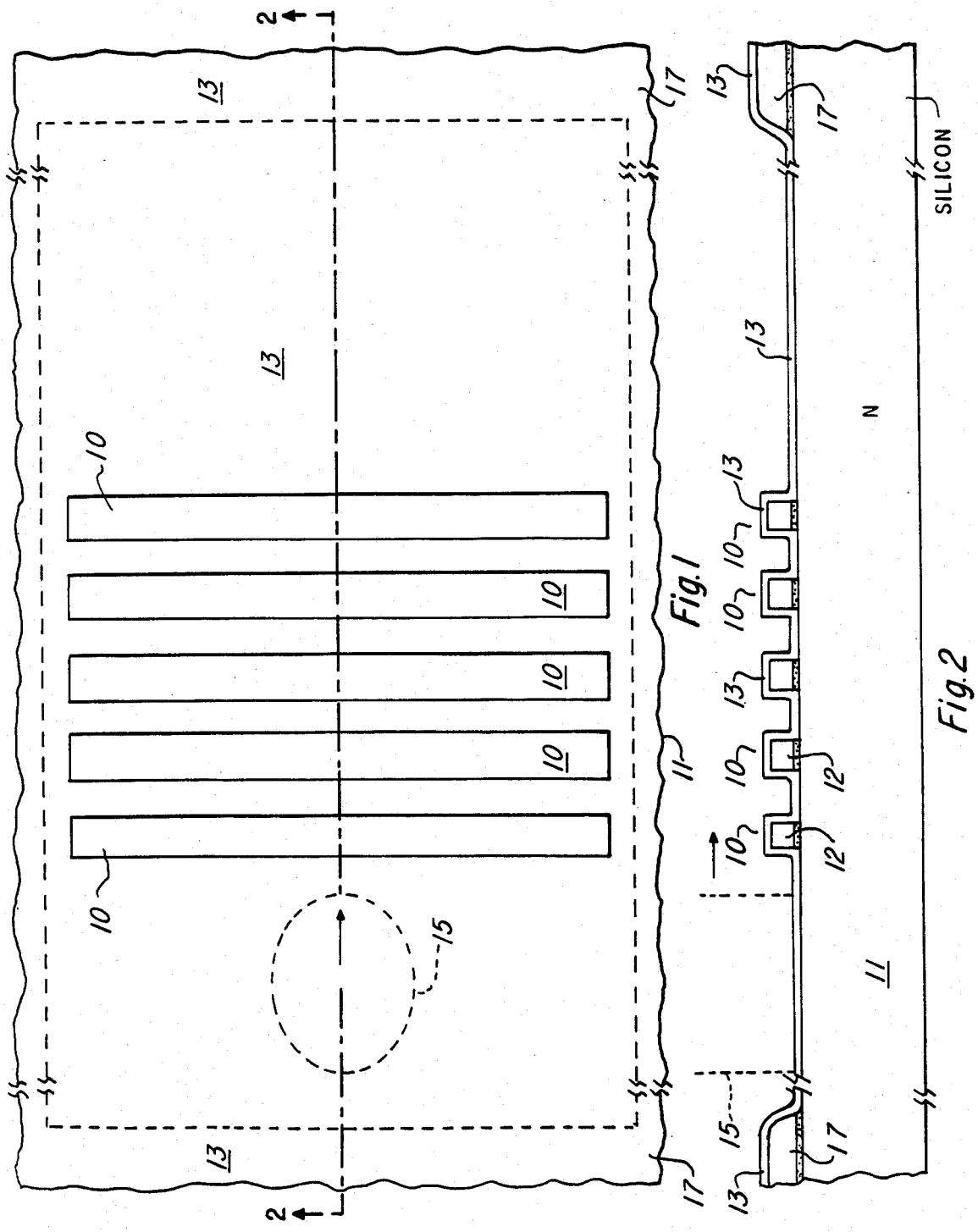

INDEXING OF LASER BEAM FOR PROGRAMMING VLSI DEVICES

BACKGROUND OF THE INVENTION

This invention relates to manufacture of semiconductor devices and more particularly to a target used in laser programming of such devices.

Redundant memory devices contain extra rows and columns of cells which are substituted when cells are faulty in the main array. The addresses of faulty rows and columns are programmed into a memory device, after testing, by a laser beam method. The laser beam is used to make or break certain connectors, depending upon the test results. In VLSI devices, the size of the lines or elements that the laser beam must focus upon are a few microns, or less. Thus, the beam must be accurately positioned as it scans a silicon slice. To this end, the beam is made to find some indexing structure or target as it enters each bar on the slice.

A major problem seen with laser scribing for redundant memory devices is the consistancy of response from these targets. The targets most widely used in production are made of a single strip of material. The width of the strip is generally larger than the spot size of the laser beam used to detect the target. The visibility of this target depends upon the difference in reflectivity between underlying layers and the target strip. The problem encountered with this type of target is that the contrast of the reflected image of the target may vary with slight differences in process. The changes in contrast cause the target image to appear to change position, disappear, or even change color (reflective becomes non-reflective and vice versa).

One target proposed by others to eliminate these problems was a single strip or valley of material much smaller than the spot size. For a 6-8 micron laser beam spot the target was 1-2 microns wide. For this type of target the problems described previously still remained, plus new problems were encountered; for example, a shift in the apparent position of the image due to false edge indications. Another problem introduced was a consequence of the small size of the target structure with respect to the laser spot size. The accuracy with which this prior target could be found diminished because of the uncertainties in locating the center of the small structure within the diameter of a large spot. Ultimately the smaller line target was found to be of no net advantage over a larger structure as the first target.

In particular, the larger target (currently most widely used) was made from a single strip of material that was the same as the link to be blown. The strip was typically about 80 microns in length and 12 microns wide. There was a 50 micron wide clear area around the strip. The target was uncovered during processing to allow the target material to be completely unobstructed by any overlaying level of material that could reduce the contrast of the tartet image. The design of the strip was such that the strip was larger in width than the spot size of the laser.

The smaller target was similar in construction to the first target with the exception that the line width was smaller. Typically, the line width for this target was 1-2 microns for a 6-8 micron size beam.

A third type of prior target consisted of a photo conductive target that used photon induced conductivity of a moat strip as the detection mechanism for the position of the laser beam. This third type of target was constructed by placing a material over the moat that would block the laser beam. As the laser beam was scanned over the structure the moat was conductive as long as the laser beam was over the moat area. As the laser beam moved on to the blocking material the conductivity of the moat was reduced. The change in conductivity of the moat with laser beam position defined an edge that the laser alignment system was to be referenced to.

All these targets described so far have been used for the 1.06 micron line of the Nd:YAG laser. The 0.53 micron of the Nd:YAG laser presents a special problem to the targets. Only the photo conductive target which uses photo induced currents seems to work at all for the 0.53 micron laser.

The purpose of the improved target of this invention is to resolve these problems and at the same time improve the laser accuracy. The new target is built in such a way as to be "process independent". The previous targets vary in quality due to changes in processing parameters from one side of the slice to the other. The process may also vary from one slice to another. In particular, the targets described previously were affected by the final metal etch and the various oxide thicknesses used to construct the device.

The target of the invention is suitable for any wave length of light in the laser beam as long as some simple design rules are followed. Furthermore, the target does not lose accuracy as the small sized target. In fact, the target has been found to be more accurate than the wide strip target mentioned above.

It is the principal object of this invention ot provide an improved method of laser beam programming of VLSI semiconductor devices, particularly an improved target for indexing a laser beam. Another object is to provide an indexing target which produces a constant and readily identifiable response independent of processing variables, materials, and the like.

SUMMARY OF THE INVENTION

In accordance with one embodiment of the invention, a semiconductor device etc. a target for a laser beam consists of a plurality of closely spaced lines that causes the generation of an readily-identifiable read-out so that the laser beam can be indexed when performing laser scribing for redundant memory devices or the like.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a plan view, greatly enlarged, of a small part of a semiconductor chip having the target structure of the invention;

FIG. 2 is an elevation view in section of the device of FIG. 1, taken along the line 2—2 in FIG. 1.

DETAILED DESCRIPTION OF THE SPECIFIC EMBODIMENT

Referring to FIGS. 1 and 2 the target for indexing a laser beam according to the invention consists of a plurality of small parallel strips 10 on a semiconductor substrate 11. The substrate 11 is usually a slice of silicon, perhaps 100 to 150 mm in diameter, but it could be silicon-on-sapphire or other material. The strips 10 are composed of polysilicon 12, for example, covered with a top reflective layer 13, typically aluminum. A laser beam 15 scans along the surface of the slice; this target produces a readily identifiable signature to a photoresponsive device used to detect reflection from the slice.

The laser target disclosed here, for use with integrated circuit designs such as redundant DRAMs is made from small parallel strips 10 of material that are the same as the break-link or make-link structures within the memory device that are to be operated on. It has been found that preferably there should be no fewer than four strips 10 and no more than six strips. The strips 10 should be no wider than one fourth of the diameter of the laser spot 15 used to detect the target and scribe the links, nor should the strips 10 be smaller than one-eighth the spot size. The spacing between the strips 10 should be the same as the strip width. The length of the target strips is determined by the accuracy of the alignment system used to prealign the device. Typically the length of the strips is 80 microns. Usually the beam is indexed to two of these targets positioned in an "L" shape, at right angles to one another. The target strips 10 may sit on any type of material compatible with the process being used. For example, second-level polysilicon targets may sit on the substrate 11, on gate oxide, on thick field oxide 17, or first level polysilicon (there is a separating oxide that keeps the second-level poly from actually touching the first poly or the substrate 11). The only requirement is that the target have a clear area perpendicular to the strips. The length of the clear area is determined by the accuracy of the prealignment of the device. At the last possible step in the process of making the device any layers of material overlying the strips 10 are removed. The target strips 10 should be clear of all overlaying material at the last metallization step. At this step a sheet of metal 13 is patterned over the strips and the clear area. No other material is to be put over the target as this would have a tendency to degrade the reliability of the target. However, the target has been tested with materials over the reflective layer and found to work.

One feature is that the design uses multiple strips of the small line structure proposed earlier. Each of the small line structures, when used separately, is very hard to find accurately. However, when the strips are put together the image contrast seen by the laser is stronger than the single line image. Since the total structure of the target is larger than the spot size in this invention, the uncertainties in edge position are reduced.

The target structure of FIGS. 1 and 2 is much less sensitive to contrast with the underlying layers. A second feature of the invention is the use of a reflective coating over the target. The ability to see the target strips 10 when it is completely covered by a reflective material 13 is not expected. The reflective covering 13 prevents the laser beam 15 from reaching the underlying layers of material. Thus, the difference in reflectivity of the material 12 of the target strips 10 to the surrounding cannot be used as the mechanism for image contrast change. The new mechanism for changing the contrast of the target area is the scattering of the laser beam 15 off of the edges of the strips 10. The fine line nature of the strips with or without the reflective covering show up as a very dark line to the laser imaging system due to the high amount of light scattered by the structure.

The process of constructing the target strips 10 with the reflective final surface 13 serves to protect the target during processing. The final reflective surface 13 serves to reduce the process dependency of the image contrast.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A target for indexing a laser beam in the manufacture of semiconductor devices, comprising:
a plurality of strips positioned perpendicular to the path that the laser beam travels along a face of a semiconductor body, the width of each strip being in the range of $\frac{1}{8}$ to $\frac{1}{4}$ the diameter of the beam and the width of each strip and the spacing between strips being less than the size of the laser beam.

2. A device according to claim 1, wherein the sum of the widths of the strips and spacing between strips is larger than the size of the laser beam.

3. A device according to claim 1, wherein said strips are covered with a reflective coating.

4. A device according to claim 1, wherein the number of strips is in the range of 4 to 6.

5. A device according to claim 2, wherein the width of the strips is about equal to the spacing between adjacent strips.

6. A device according to claim 3, wherein the effective coating is metal.

7. A target for indexing a laser beam in the manufacture of semiconductor devices, comprising:
a plurality of narrow strips positioned perpendicular to the path that the laser beam travels along a face of a semiconductor body, the width of each strip and the spacing between the strips both being less than the size of the laser beam, said strips and the spaces between the strips having a reflective coating.

* * * * *